United States Patent [19]
Gross, Jr.

[11] Patent Number: 6,107,949
[45] Date of Patent: Aug. 22, 2000

[54] FLASH ANALOG-TO-DIGITAL CONVERTER WITH MATRIX-SWITCHED COMPARATORS

[75] Inventor: George Francis Gross, Jr., Reading, Pa.

[73] Assignee: Lucent Technologies Inc., Murray Hill, N.J.

[21] Appl. No.: 09/010,872

[22] Filed: Jan. 22, 1998

Related U.S. Application Data

[60] Provisional application No. 60/038,492, Feb. 24, 1997.

[51] Int. Cl.$^7$ .............................. H03M 1/12; H03M 1/36
[52] U.S. Cl. ........................................... 341/159; 341/156
[58] Field of Search ..................................... 341/159, 156, 341/160, 166, 118, 133, 144, 158

[56] References Cited

U.S. PATENT DOCUMENTS

| | | | |
|---|---|---|---|
| Re. 35,472 | 3/1997 | Frigerio et al. .......................... | 341/156 |
| 4,542,370 | 9/1985 | Yamada et al. .......................... | 341/133 |
| 4,686,511 | 8/1987 | Koen ....................................... | 341/118 |
| 4,903,028 | 2/1990 | Fukushima .............................. | 341/156 |
| 5,355,135 | 10/1994 | Redfern .................................. | 341/156 |
| 5,463,395 | 10/1995 | Sawai ..................................... | 341/156 |
| 5,534,862 | 7/1996 | Gross et al. ............................. | 341/144 |
| 5,581,254 | 12/1996 | Rundel .................................... | 341/155 |
| 5,703,588 | 12/1997 | Rivoir et al. ............................ | 341/159 |
| 5,726,653 | 3/1998 | Hsu et al. ........................... | 341/159 X |
| 5,731,775 | 3/1998 | Gross et al. ............................. | 341/155 |
| 5,936,566 | 8/1999 | Park ........................................ | 341/159 |

OTHER PUBLICATIONS

"An Enhanced Successive–Approximation Circuit For A/D Conversion," by Christopher M. Webster and Donald Comer, IEEE 1993 Custom Integrated Circuits Conference, pp. 28.2.1–28.2.4.

"A 10–Bit 60 MSPS Flash ADC," by Chuck Lane, Analog Devices, Greensboro, NC, Paper No: 2.2.

"A 10–b 15–MHz CMOS Recycling Two–Step A/D Converter," by Bang–Sup Song, Seung–Hoon Lee, and Michael F. Tompsett, IEEE Journal of Solid–State Circuits, vol. 25, No. 6, Dec. 1990, pp. 1328–1338.

"A Technique for Reducing Differential Non–Linearity ERrors in Flash A/D Converters," by Kevin Kattmann and Jeff Barrow, Analog Devices Computer Labs Division, Greensboro, NC, IEEE International Solid State Circuits Conference, ISSCC91/Session 10, pp. 170–171.

"A 100 MHz 8 Bit CMOS Interpolating A/D Converter", by M. Steyaert, R. Roovers and J. Craninckx, IEEE 1993 Custom Integrated Circuits Conference, pp. 28.1.1–28.1.4.

"Subranging ADCs Operate at High Speed with High Resolution", by Ray Ushani, Datel Inc., EDN Designers Guide, EDN, Apr. 11, 1991, pp. 139–144.

"Integrating Data Modems with Group 3 Fax Capability Takes a World of Experience." Rockwell International, Circle No: 173, EDN Apr. 11, 1991, pp. 145–152.

"Clever Designs Spawn 40–MHz/10–Bit/0.2–W ADCs," by Frank Goodenough, Electronic Design 123, Jan. 24, 1994.

*Primary Examiner*—Brian Young
*Assistant Examiner*—Patrick Wamsley
*Attorney, Agent, or Firm*—David L. Smith

[57] ABSTRACT

An integrated circuit includes a converter for converting a signal from one form to another, one of the forms being analog and the other form being digital. The converter includes a voltage gradient having a plurality of MSB taps spaced there-along with the plurality of LSB taps spaced between adjacent MSB taps. An array of comparators are coupled to the voltage gradient with each comparator providing an output. A matrix of switches are coupled between the voltage gradient and the comparator inputs. The first inputs of the comparators in the array are coupled to a sample-and-hold circuit which provides a sample of the analog input signal. Decode and control logic are coupled to comparator outputs to provide a control to the matrix of switches to determine which taps of the voltage gradient are coupled as second inputs to the comparators in the array of comparators and also to provide the resultant output representation of the sampled analog input signal.

40 Claims, 3 Drawing Sheets

FLASH ANALOG-TO-DIGITAL CONVERTER WITH MATRIX-SWITCHED COMPARATORS

Priority of U.S. Provisional Application Ser. No. 60/038,492 filed on Feb. 24, 1997 is hereby claimed.

TECHNICAL FIELD

This application relates generally to analog-to-digital converters, and more particularly to flash converters that include subranging to achieve a greater number of bits of conversion with a finite amount of hardware.

BACKGROUND OF THE INVENTION

Analog-to-digital (ADC) converters convert samples of an analog signal to a corresponding digital sequence, resulting in a digitally coded signal. ADC's that employ a resistor string couple intermediate taps at the resistor junctions, and possibly also at the resistor-power source junctions, to one input of comparators to generate a digital code corresponding to an analog signal captured by a sample-and-hold circuit and applied to another comparator input. The number of resistor string resistors, as well as the number of comparators, required to provide an n-bit converter is substantially $2^n-1$. It can be seen as the number of bits increase, the number of comparators and resistors increases more rapidly. When subranging is employed to achieve the conversion, various techniques exist to reduce the number of resistors in the resistor string, and also the number of comparators, from $2^n-1$ to some smaller number, depending upon the subranging technique employed and the division between number of most significant bits and number of least significant bits.

One technique employs a multi-step flash ADC. A flash converter is chosen for its speed of conversion in that a trade-off is made between speed and hardware required to accomplish the conversion. An analog signal from a sample-and-hold circuit is applied to one input of each comparator in a group of comparators while a reference voltage is applied to the resistor string. Taps from the resistor string are applied to the other input of each of the comparators in the group, and a number, M, of most significant bits of a digitally coded signal are determined. An analog signal corresponding to the digitally coded signal as represented by the M most significant bits is generated in a precision digital-to-analog converter. The analog output from the precision digital-to-analog converter, in one variation, is subtracted from the analog signal held by the sample and hold circuit, producing a residue. The residue is multiplied by a gain producing a gained residue which is applied to one input of each comparator in a group of comparators while taps from the resistor string are applied to the other input of each comparator to determine a number L of least significant bits. Another variation reduces the voltage range applied to the resistor string and reapplies the original sample-and-hold voltage to the comparator input.

This two-step (more generally multi-step) flash ADC technique has the shortcoming that between the flash steps determining the M most significant bits and the L least significant bits, are intermediate analog processes. The intermediate analog processes are serial, and each process requires some settling time. Allowing for the settling time increases the time to convert an analog sample to a corresponding digital code and thus limits the speed at which the conversion can be completed.

Another technique in subranging converters applies a reference voltage to a resistor string to determine M most significant bits using a resistor string with relatively large resistors. Subsequent to determining the M most significant bits, one of the resistors of the resistor string is removed from the resistor string and replaced with a resistor string segment of finer resistors. The reference voltage is reapplied to the resistor string and an adequate time period must be allowed to pass for the resistor string to settle. Subsequently, the L least significant bits are determined. In this technique, as in the technique above, allowing for the settling time increases the time to convert an analog sample to a corresponding digital code and thus limits the speed at which the conversion can be completed. It is noteworthy that the reference voltage need not be disconnected during replacement of a portion of the resistor string, but the settling time issue remains.

What is needed is a converter that overcomes the shortcomings of the prior art subranging ADC's to eliminate the intermediate analog processing steps, and thus the need for settling time, and thereby increase the speed at which analog-to-digital conversion can be completed.

SUMMARY OF THE INVENTION

In accordance with an illustrative embodiment of the present invention, an integrated circuit includes a converter for converting a signal from one form to another, one of the forms being analog and the other form being digital. The converter includes a voltage gradient having a plurality of MSB taps spaced there-along with the plurality of LSB taps spaced between adjacent MSB taps. An array of comparators are coupled to the voltage gradient with each comparator providing an output. A matrix of switches are coupled between the voltage gradient and the comparator inputs. The first inputs of the comparators in the array are coupled to a sample-and-hold circuit which provides a sample of the analog input signal. Decode and control logic are coupled to comparator outputs to provide a control to the matrix of switches to determine which taps of the voltage gradient are coupled as second inputs to the comparators in the array of comparators and also to provide the resultant output representation of the sampled analog input signal.

DETAILED DESCRIPTION

Figure 1:
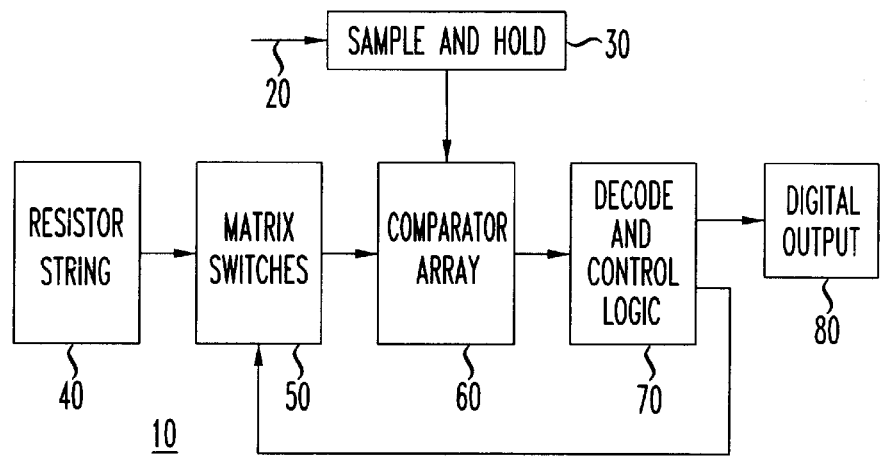
FIG. 1 is a block diagram of a converter in accordance with an illustrative embodiment of the present invention.

A block diagram of an analog-to-digital converter in accordance with the present invention is shown in FIG. 1. Analog-to-digital converter 10 receives an analog signal at an input 20. The sample-and-hold circuit 30 acquires a sample of the analog signal, as is known in the art, and presents as its output the acquired sample. The output of sample-and-hold circuit 30 is held until the acquisition of a subsequent sample. The repetitive processing by analog-to-digital converter 10 of sequential samples of the analog signal provides the appearance of being a continuous process. The sample-and-hold circuit 30 may or may not be a portion of analog-to-digital converter 10. The output of sample-and-hold circuit 30 is applied to one input of each comparator in comparator array 60. Alternatively, the sampling of the analog input signal can be distributed. For example, although sample-and-hold circuit 30 is illustrated as providing a single sample-and-hold function, the analog input signal could be provided to each of the comparators C1 through C7, with the sampling occurring in a distributed fashion at each comparator.

Resistor string 40 is coupled between energy source 42 (shown in FIG. 2) and a known potential at node 44 (shown in FIG. 2), which is typically ground. Matrix switches 50 couple between resistor string 40 and a second input of each comparator in comparator array 60. The outputs from comparator array 60 provide inputs to decode and control logic circuit 70. The decode and control logic circuit provides both a digital output 80 and control for matrix switches 50.

An illustrative embodiment of the invention will be described in which a 6-bit converter, including three bits of subranging, is achieved in a two-step flash analog-to-digital conversion. The more general case will be evident from the disclosure. The choice of the number of bits subranged is user-determined, typically prior to fabricating the circuit. For a two-step flash analog-to-digital converter, maximum utilization of the comparators is achieved when half, or as close to half as an integer number of bits will permit, are subranged. In a multiple-step flash, the number of bits converted in each step should be approximately equal to minimize the number of comparators required and, in turn, to minimize the area required to fabricate the converter as well as the power consumed by the converter. However, the invention is not limited to a two-step flash converter; a multiple-step flash converter may be employed. Furthermore, the number of bits subranged may be less than, greater than or equal to the number of bits that are not subranged.

Figure 2:
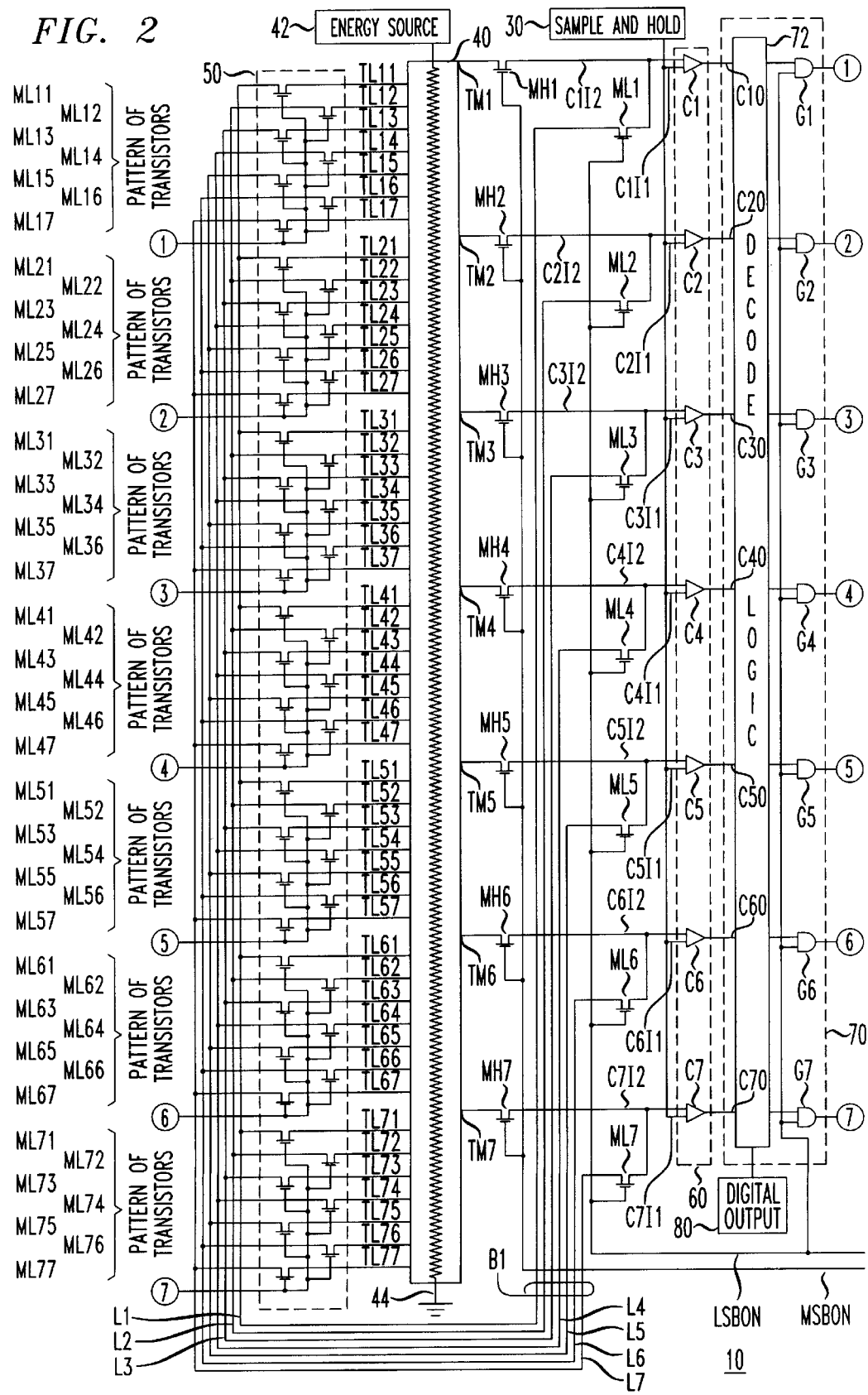
FIG. 2 is a schematic diagram of an illustrative embodiment of the converter shown in FIG. 1.

A schematic diagram of an illustrative embodiment of a two-step analog-to-digital converter in accordance with the present invention is shown in FIG. 2. The illustrative embodiment shows a 6-bit flash analog-to-digital converter in which three bits are subranged.

Resistor string 40 is coupled between an energy source, that may or may not be a part of converter 10, and a known potential at node 44. The energy source may be a constant current, or a voltage, as is known in the art. Resistor string 40 may be fabricated in accordance with the teaching of U.S. Pat. No. 5,534,862, the disclosure of which is hereby incorporated by reference. Resistor string 40 is comprised of a plurality of series resistors. The resistance value of the series resistors are application dependent and can be readily selected by one skilled in the art based on a variety of parameters such as the power to be dissipated, the potential across or developed across the resistor string, the number of resistors in the resistor string, the number of bits of the converter, and the number of bits in the subranging portion of the converter. Alternatively, resistor string 40 can be considered a continuous resistor with taps along its length.

Resistor string 40 has taps at various points spaced along its length. There may or may not be a tap at the ends of the resistor string 40 where energy source 42 couples to resistor string 40, and at node 44. Having taps at equal distances along the length of a resistor results in equal resistances and concomitantly equal voltage drops between the taps. The taps along resistor string 40 includes taps for determining the most significant bits (MSBs) such as equally spaced taps TM1, TM2, TM3, TM4, TM5, TM6, and TM7, referred to as MSB taps. Between adjacent MSB taps, or between an MSB tap and one or both ends of resistor string 40, are more finely spaced taps referred to as LSB taps. For example, between MSB taps TM1 and TM2 are LSB taps TL11, TL12, TL13, TL14, TL15, TL16, and TL17. Similarly, between MSB taps TM6 and TM7 are LSB taps TL61, TL62, TL63, TL64, TL65, TL66, and TL67.

The presence of a tap on resistor string 40 where energy source 42 couples to resistor string 40 would require an additional comparator for detection of an overvoltage condition. The presence of a tap on resistor string 40 at node 44 would also require an additional comparator for detection of an undervoltage condition. Such overvoltage or undervoltage taps, comparators and any necessary switches may be present individually or in combination. Neither overvoltage detection nor undervoltage detection are required for the invention. A minimum area design would omit overvoltage and undervoltage detection.

The number of MSB taps TM1 through TM7 is determined by the number of comparators C1 through C7 which in turn is determined by the number of bits of the converter, the number of bits subranged, and whether overvoltage or undervoltage detection are desired. The output of sample-and-hold circuit 30 is provided as a first input CII1, C2I1, C3I1, C4I1, C5I1, C6I1 and C7I1 of respective comparators C1 through C7. The second input C1I2, C2I2, C3I2, C4I2, C5I2, C6I2, and C7I2 to each of respective comparators C1 through C7 is provided from a tap coupled to resistor string 40 either through transistors MH1 through MH7, or through transistors ML1 through ML7. Comparators C1 through C7 are high input impedance comparators that do not disturb the voltage developed on resistor string 40 when the second input of respective comparators are coupled to the resistor string.

Figure 3:
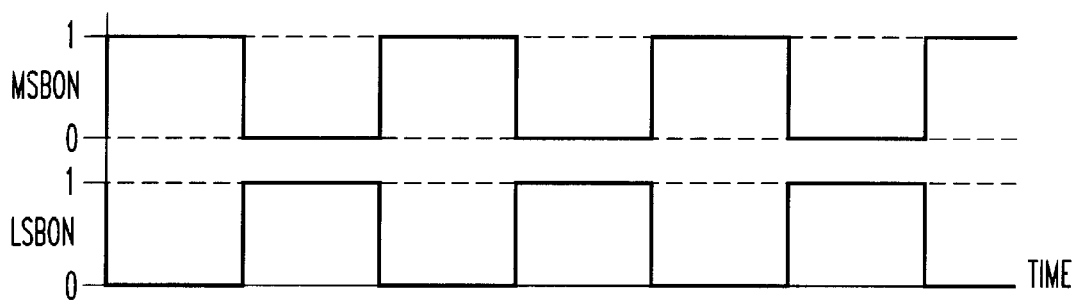
FIG. 3 shows complementary idealized waveforms useful in the converter shown in FIGS. 1 and 2.

During determination of the MSB's, the MSBON signal is high and the LSBON signal is low. Idealized versions of MSBON and LSBON signals are shown in FIG. 3. Since the MSBON signal is high during determination of the most significant bits, transistors MH1, MH2, MH3, MH4, MH5, MH6, and MH7 are switched to the conducting, or on, state and couple taps TM1, TM2, TM3, TM4, TM5, TM6, and TM7 as respective inputs to the second input C1I2, C2I2, C3I2, C4I2, C5I2, C6I2 and C7I2 of comparators C1, C2, C3, C4, C5, C6, and C7.

Since the LSBON signal is low, the output of AND gates G1, G2, G3, G4, G5, G6, and G7 are low. Since the outputs of AND gates G1 through G7 are low, switching transistors in matrix switches 50 are switched to the non-conducting, or off, state. In this manner, the taps TM1 through TM7 are coupled between resistor string 40 and the second input C1I2 through C7I2 of comparators C1 through C7. In addition, since LSBON signal is low, transistors ML1, ML2, ML3, ML4, ML5, ML6, and ML7 are switched to the non-conducting, or off, state isolating respective lines L1, L2, L3, L4, L5, L6, and L7 of bus B1 from the second inputs C1I2 through C7I2 of comparators C1 through C7. Transistors ML1 through ML7 could be removed and all isolation of resistor string 40 relative to the LSB's accomplished by matrix switches 50. While the illustrative embodiment has been shown with AND gates G1 through G7, converter 10 may be fabricated without the AND gates. The AND gates function to eliminate glitches in the matrix of switches 50 while the MSB's are being decoded. AND gates G1 through G7, while not needed for the invention, may be present to deglitch the switching transistors as a particular group of LSB's are being determined by the logic decoding the MSB's.

With a sample analog signal applied to the first inputs of comparators C1 through C7, and resistor string 40 energized, a thermometer output will occur at the outputs C1O, C2O, C3O, C4O, C5O, C6O and C7O of comparators C1 through C7. As is known in the art, the output of all comparators below the point corresponding to the analog signal developed on resistor string 40 corresponding to the analog signal sample held by sample-and-hold circuit 30 will be one state, such as high, and the output of all comparators above that point will be another state, such as low. The thermometer code indicates at which point along the resistor string the magnitude of the voltage developed between the adjacent MSB taps, where one such MSB tap is coupled as a second input to a comparator having an output is high and the adjacent MSB tap is coupled to an adjacent comparator having an output that is low, the magnitude of the analog signal is between the pair of MSB taps so coupled. Decode and control logic 70 converts the thermometer code to two outputs. The first output is the most significant bits of a digital representation of the analog signal sample converted. The bits are passed to digital output 80. The second output, which may be multiple signals, is a control output provided to AND gates G1 through G7. The output to AND gates G1 through G7 is maintained beyond the transition during which MSBON changes state.

With the completion of determining the most significant bits of a digital representation of the analog sample, both the LSBON signal and the MSBON signal change state and the least significant bits (LSB's) are determined. During determination of the LSB's, the MSBON signal is low and the LSBON signal is high.

Since the MSBON signal is low, transistors MH1 through MH7 are held in a nonconducting state isolating taps TM1 through TM7 from the second input C1I2, C2I2, C3I2, C4I2, C5I2, C6I2 and C7I2 of respective comparators C1 through C7.

With the LSBON signal high, transistors ML1 through ML7 are switched to the conductive state. This couples respective lines of bus B1 as the second input to comparators C1 through C7. Each line of bus B1 is coupled through switching transistors comprising matrix switches 50 to one of the LSB taps between each adjacent pair of MSB taps. For example, line L1 is coupled to tap TL11 between MSB taps TM1 and TM2, tap TL21 between MSB taps TM2 and TM3, tap TL31 between taps TM3 and TM4, tap TL41 between MSB taps TM4 and TM5, tap TL51 between MSB taps TM5 and TM6, tap TL61 between MSB taps TM6 and TM7, and tap TL71 between MSB taps TM7 and node 44. The other lines of bus B1 are similarly coupled between LSB taps and a second input to one of the comparators C1 through C7. All of the switches in matrix switches 50 are shown as MOSFET transistors. During determination of the LSBs, all of the switches in matrix switches 50 are switched to the non-conductive, or off state, except one subgroup. Each subgroup ML2X through ML7X of switches, where X ranges from 1 through 7, is controlled by the output of one of AND gates G1 through G7 or if the AND gates are absent, by an output from decode and control logic 70. Decode and control logic 70, in one embodiment of the invention, provides that one of the AND gate outputs is high at a time. The AND gate output that is high corresponds to the pair of comparators described above, which due to the thermometer code output one has an output that is one state, such as high, with all comparators below (as shown in FIG. 2) it also having outputs that are the same state, and an adjacent comparator that has an output that is of the other state, such as low, with all comparators above it (as shown in FIG. 2) also having outputs that are the same state.

For example, if comparators C5, C6 and C7 have outputs that are high, and comparators C4, C3, C2, and C1 have outputs that are low, the analog sample would represent a voltage developed on resistor string 40 between tap TM4 and tap TM5 during the MSB determination. Thus, the output of AND gate G4 would be high. The high output of AND gate 4 would turn on or switch to the conductive state, during determination of the least significant bits, transistors ML41 through ML47. Transistor ML41 being switched to the conductive state would couple tap TL41 through line L1 of bus B1 and transistor ML1 to be the second input C1I2 to comparator C1. Similarly, transistor ML42 couples tap TL42 through line L2 of bus B1 and transistor ML2 to be the second input C2I2 to comparator C2. Transistor ML43 couples tap TL43 through line L3 of bus B1 and transistor ML3 to be the second input C3I2 to comparator C3. Transistor ML44 couples tap TL44 through line L4 of bus B1 and transistor ML4 to be the second input C4I2 to comparator C4. Transistor ML45 couples tap TL45 through line L5 of bus B1 and transistor ML5 to be the second input C5I2 to comparator C5. Transistor ML46 couples LSB tap TL46 through line L6 and transistor ML6 to be the second input C6I2 to comparator C6. Transistor ML47 couples LSB tap TL47 through line L7 of bus B1 and transistor ML7 to be the second input C7I2 to comparator C7. During determination of the LSB's, transistors MH1 through MH7 isolate MSB taps TM1 through TM7 from comparator inputs. With subgroup 4 comprising transistors ML41 through ML47 of matrix switches 50 switched to the conductive state for determination of the LSB's, comparator 10 is set up to determine the LSB's.

Decoding control logic 70, and more specifically decode logic 72 evaluate the new thermometer code established at the outputs C1O, C2O, C3O, C4O, C5O, C6O and C7O of comparators C1 through C7 to generate a second set of bits, the least significant bits, which are output to digital output 80 and concatenated with the MSB's previously outputted to digital output 80, to provide a digital output representative of the sampled analog input. Once the LSB's are determined, both LSBON and MSBON signals switch state. Converter 10 receives a new analog sample and converts the new sample to a digital output, as described above.

The LSBON and MSBON signals may be generated from the clock signal driving converter 10, such as a CLOCK and $\overline{CLOCK}$ signals. Preferably, the LSBON and MSBON signals are non-overlapping.

The illustrative embodiment of the invention shown in FIGS. 1 and 2 disclose a converter in which a single array of comparators 60 is switched to determine both the most significant bits and the least significant bits of an output.

Figure 4:
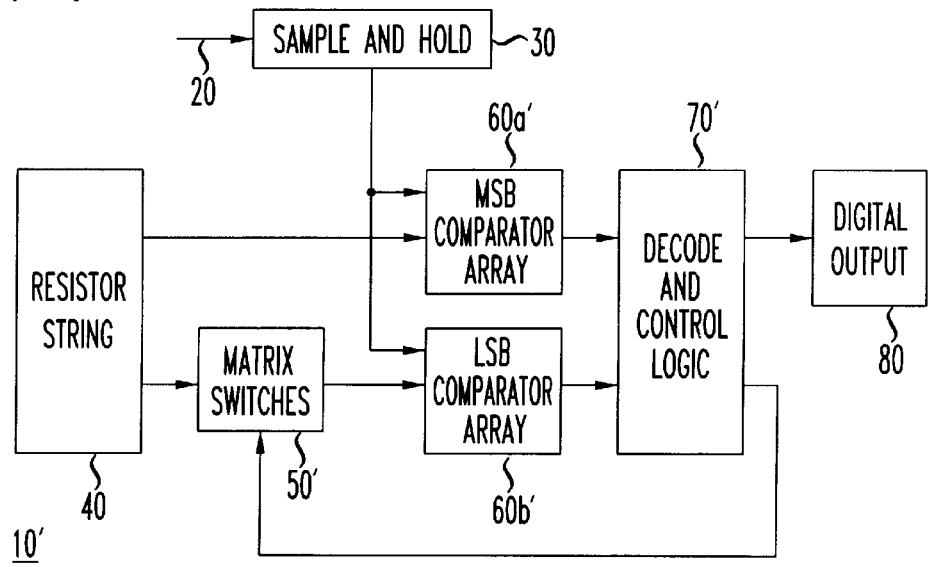
FIG. 4 is a block diagram of an alternative illustrative embodiment of the present invention.
Figure 5:
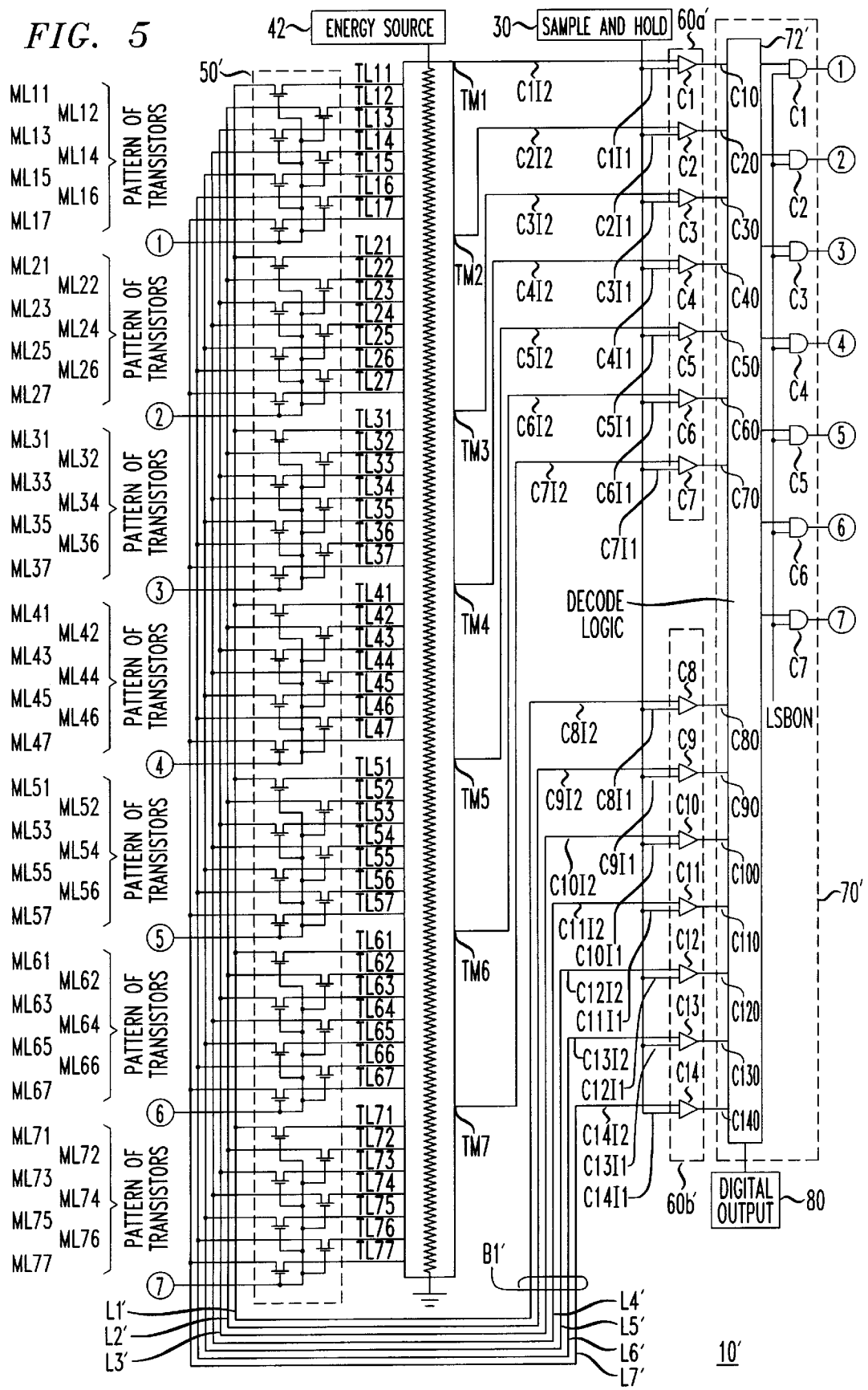
FIG. 5 is a schematic diagram of an illustrative embodiment of the alternative converter shown in FIG. 4.

FIGS. 4 and 5 show an alternative illustrative embodiment of the invention in which there are two arrays of comparators. One array of comparators is dedicated to determining the most significant bits, whereas the second array of comparators is dedicated to determining the least significant bits. In the alternative illustrative embodiment, there is no need for isolation transistors MH1 through MH7 and ML1 through ML7. Like reference numerals have been used where the function provided by an element in the alternative illustrative embodiment is the same as or similar to the function provided by a similarly numbered element in the illustrative embodiment in FIGS. 1 and 2. Operation of the alternative illustrative embodiment should be readily evident from the above description of the illustrative embodiment shown in FIGS. 1 and 2, together with the following description.

Converter 10' shown in FIGS. 4 and 5 operates in a manner similar to converter 10 to convert either an analog signal or a sample of an analog signal to a corresponding digital code. Comparator 10' operates two arrays of comparators, 60a' and 60b'. An analog signal is received at input 20 and provided to sample-and-hold circuit 30. The output of sample-and-hold circuit 30 is applied to one input of each comparator in both arrays of comparators 60a' and 60b'. The second inputs C1I2 through C7I2 of comparators C1 through C7 are coupled to MSB taps TM1 through TM7. During the first flash step, MSB determination, the LSBON signal is low. The LSBON signal low maintains the outputs of AND gates G1 through G7 low isolating LSB taps from bus B1'. As stated above, AND gates G1 through G7 are present to deglitch the switching transistors, but are not required by the invention.

Comparators C1 through C7 of the MSB comparator array 60a' generate a thermometer code that is decoded by decode and control logic 70'. Decode logic 72' generates the most significant bits of the digital code corresponding to the sample analog signal being converted and passes the MSBs to digital output 80. Decode and control logic 70' also generates outputs to AND gates G1 through G7, as described above.

With the MSBs generated, LSBON goes high and a second flash step begins to generate the LSB's of the digital code corresponding to the sample of the analog signal being converted. When LSBON goes high, the output of one of the AND gates G1 through G7 goes high. The output of an AND gate going high causes the corresponding subgroup of matrix switches 50' to couple the associated LSB taps to lines L1 through L7 of bus B1', and thus couple the associated LSB taps as second inputs C8I2 through C14I2 of comparators C8 through C14. Comparators C8 through C14 comprise the LSB comparator array 60b'. The first inputs C8I1 through C14I1 of respective comparators C8 through C14 are coupled to the output of sample-and-hold circuit 30. Comparators C8 through C14 generate outputs C8O through C14O which are inputs to decode logic circuit 72'. Outputs C8O through C14O generate a thermometer code that is decoded to produce the LSB bits of the digital code corresponding to the sample analog signal being converted. The LSB bits are passed to digital output and concatenated with the MSB bits to produce a digital output that is the digital code corresponding to the sample analog signal converted.

The LSBON signal goes low causing the outputs of AND gates G1 through G7 to go low, and to isolate the LSB taps from lines of bus B1' and thus comparators C8 through C14 from resistor string 40. The converter is ready for a subsequent analog sample and conversion thereof.

The invention is particularly useful in communications systems and equipment employing integrated circuits in analog-to-digital converter applications where chip area, power dissipation and speed of conversion are of concern. The invention may be implemented, for example, in a digital signal processor fabricated using any known very large scale integrated circuit fabrication process.

While the illustrative embodiments of the invention have been described as having a specific number of steps, LSB's, MSB's, comparators, switches, or circuits, the invention is not so limited. For example, while a resistor string has been illustrated as having a specific number of taps, the invention is not limited thereto. Also, while the illustrative embodiments of the invention depict a resistor string as a multiple reference voltage generator adapted to provide a voltage gradient having a predetermined number of substantially equal-increment voltage gradient outputs, the voltage gradient could be generated by other known methods by those skilled in the art, including but not limited to, weighted capacitor arrays, and switched current sources. The order of the comparator connections or inputs to logic or outputs from logic may vary. While the illustrative embodiments operate in a voltage mode, the invention also encompasses current mode operation. Furthermore, the invention may be implemented in differential-mode rather than the single-ended mode illustrated.

Many variations on switching could be implemented within the scope of the invention. Some implementations would require more switches than illustrated others would require fewer switches. For example, the MSB switches could be duplicated in the matrix of switches. Tradeoffs could be made between and among numbers of comparators, switches, and complexity of decoding logic.

The invention claimed is:

1. An integrated circuit including a converter for converting a signal from analog form to digital form comprising:

a multiple reference voltage generator adapted to provide a voltage gradient, the multiple reference voltage generator having equal-increment voltage gradient outputs, the voltage gradient outputs defining first taps for determining a first number of most significant bits, and between at least two of the first taps defining second taps for determining a second number of least significant bits;

at least two comparators, each of the at least two comparators having a first input for receiving a first input signal, a second input adapted to be coupled to one of the equal-increment voltage gradient outputs, and an output;

a plurality of switches adapted to initially couple the first taps to the comparator second inputs to determine the most significant bits, and adapted to couple the second taps to the comparator second inputs to determine the least significant bits; and decode and control logic circuitry coupled to the outputs of the at least two comparators, the decode and control logic circuitry providing a first output adapted to control the plurality of switches to determine which of the first and second taps are coupled as second inputs of the at least two comparators and which of the first and second taps are isolated from second inputs of the at least two comparators.

2. An integrated circuit as recited in claim 1, wherein the multiple reference voltage generator is a resistor string.

3. An integrated circuit as recited in claim 2, wherein the resistor string is voltage driven.

4. An integrated circuit as recited in claim 3, wherein the resistor string is current driven.

5. An integrated circuit as recited in claim 1, wherein the first input signal to each comparator is an analog signal.

6. An integrated circuit as recited in claim 1, wherein the first input signal to each comparator is a sample of an analog signal.

7. An integrated circuit as recited in claim 1 wherein the converter is an analog-to-digital converter.

8. An integrated circuit as recited in claim 1, further comprising a sample-and-hold circuit to provide a sample of an analog signal as the first input signal applied to first inputs to the at least two comparators.

9. An integrated circuit as recited in claim 1, wherein the converter is single-ended.

10. An integrated circuit as recited in claim 1, wherein the at least two comparators comprises first and second arrays of comparators, the second inputs of the comparators of the first array of comparators coupled to taps, and the second inputs of the comparators of the second array of comparators coupled to respective switches in the plurality of switches.

11. An integrated circuit as recited in claim 1, further comprising a first isolation switch coupled between the second input of at least one of the at least two comparators and the taps, the isolation switch capable of isolating the second input from first taps when in a first state and connecting the second input to the first taps when in a second state.

12. An integrated circuit as recited in claim 1, wherein there are a predetermined number of equal-increment voltage gradient outputs.

13. An integrated circuit as recited in claim 1, wherein there are a predetermined number of first taps.

14. An integrated circuit as recited in claim 1, wherein there are a predetermined number of second taps.

15. An integrated circuit as recited in claim 1, wherein the first number of most significant bits is the same as the second number of least significant bits.

16. A method of operating a converter for converting a signal from one form to another, comprising the steps of:
 applying the signal to first inputs of plural comparators;
 switching selected first voltage gradient taps to provide second inputs to the comparators;
 decoding comparator outputs to determine an adjacent pair of first voltage gradient taps between which the corresponding comparator outputs differ, indicating the magnitude of the signal lies between the adjacent pair of first voltage gradient taps; and
 switching selected second voltage gradient taps between the adjacent pair of first voltage gradient taps to provide respective second inputs to a plurality of comparators.

17. A method of operating a converter as recited in claim 16, further comprising the step of:
 determining a first number of most significant hits as part of decoding the comparator outputs to determine an adjacent pair of first voltage gradient taps.

18. A method of operating a converter as recited in claim 17, further comprising the step of:
 decoding the comparator outputs to determine a second number of least significant bits subsequent to switching selected second voltage gradient taps between the adjacent pair of first voltage gradient taps to provide respective second inputs to the plurality of comparators.

19. A method of operating a converter as recited in claim 18, further comprising the step of:
 concatenating the first number of most significant bits and the second number of least significant bits to provide a digital representation of the sample of the signal.

20. A method of operating a converter as recited in claim 16, wherein the step of applying the signal comprises applying a sample of the signal to first inputs of a plurality of comparators.

21. A method of operating a converter as recited in claim 16, further comprising the step of:
 decoding the comparator outputs to determine a second number of least significant bits subsequent to switching selected second voltage gradient taps between the adjacent pair of first voltage gradient taps to provide respective second inputs to the plurality of comparators.

22. A converter for converting a signal from analog form to digital form, comprising:
 a multiple reference voltage generator adapted to provide a voltage gradient, the multiple reference voltage generator having voltage gradient outputs defining first taps for determining a number of most significant bits;
 second taps between adjacent ones of the first taps for determining a number of least significant bits;
 a plurality of comparators, each ol the comparators having a first input for receiving a first input signal, a second input adapted to be coupled to one of the voltage gradient outputs, and an output;
 a plurality of switches adapted to initially coupled the first taps to the comparator second inputs to determine the most significant bits, and adapted to couple at least some of the second taps to the comparator second inputs to determine the least significant bits; and
 decode and control logic circuitry coupled to the outputs of the comparators, the decode and control logic circuitry providing an output adapted to control the plurality of switches to determine which of the first and second taps are coupled as second inputs of the plurality of comparators and which of the first and second taps are isolated from second inputs of the plurality of comparators.

23. A converter as recited in claim 22, wherein the converter is fabricated in an integrated circuit.

24. A converter as recited in claim 22, wherein the first input signal to each comparator is a sample of an analog signal.

25. A converter as recited in claim 22, wherein the converter is an analog-to-digital converter.

26. A converter as recited in claim 22, wherein the multiple reference voltage generator is a resistor string.

27. A converter as recited in claim 22, wherein the converter is single-ended.

28. A converter as recited in claim 22, wherein the voltage gradient outputs are of equal increments.

29. A converter as recited in claim 22, further comprising a sample-and-hold circuit to provide a sample of an analog signal as the first input signal applied to first inputs of the comparators.

30. a converter for converting a signal from analog form to digital form, comprising:
 a multiple reference voltage generator adapted to provide a voltage gradient, the multiple reference voltage generator having first taps providing voltage gradient outputs spaced along the voltage gradient for determining a number of most significant bits, and second taps providing voltage gradient outputs between the first taps for determining a number of least significant bits, the second taps spaced at closer intervals along the voltage gradient than the first taps;
 a plurality of comparators, each of the comparators having a first input for receiving a first input signal, a second input adapted to be coupled to one of the voltage gradient outputs, and an output;
 a plurality of switches adapted to initially couple the first taps to the comparator second inputs to determine the most significant bits, and adapted to couple the second taps the comparator inputs to determine the least significant bits; and
 decode and logic control circuitry coupled to the outputs of the comparators, the decode and control logic circuitry providing an output adapted to control the plurality of switches to determine which taps are coupled as second inputs of the plurality of comparators and which taps are isolated from second inputs of the plurality of comparators.

31. A converter as recited in claim 30, wherein the first taps are coupled as second inputs to the comparators, with the second taps isolated from second inputs of the comparators, during determination of the most significant bits, and the second taps between first taps where a thermometer code transition occurs are coupled as second inputs to the comparators during determination of the least significant bits.

32. A converter as recited in claim 30, wherein the converter is fabricated in an integrated circuit.

33. A converter as recited in claim 30, wherein the first input signal to each comparator is a sample of an analog signal.

34. A converter as recited in claim 30, wherein the converter is an analog-to-digital converter.

35. A converter as recited in claim 30, wherein the multiple reference voltage generator is a resistor string.

36. A converter as recited in claim 30, wherein the converter is single-ended.

37. A converter as recited in claim 30, wherein the voltage gradient outputs are of equal increments.

38. A converter as recited in claim 30, further comprising a sample-and-hold circuit to provide a sample of an analog signal as the first input signal applied to first inputs of the comparators.

39. A converter as recited in claim 30, wherein the comparators used to determine the most significant bits are the same comparators used to determine the least significant bits.

40. A converter as recited in claim 30, wherein the comparators used to determine the most significant bits are not the same comparators used to determine the least significant bits.

* * * * *